US008811540B2

(12) United States Patent
Morris et al.

(10) Patent No.: US 8,811,540 B2
(45) Date of Patent: *Aug. 19, 2014

(54) DIGITAL RECEIVER

(71) Applicant: Microsoft Corporation, Redmond, WA (US)

(72) Inventors: Bradley John Morris, Ottawa (CA); Arthur Thomas Gerald Fuller, Kanata (CA)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/915,276

(22) Filed: Jun. 11, 2013

(65) Prior Publication Data

US 2013/0279633 A1  Oct. 24, 2013

Related U.S. Application Data

(63) Continuation of application No. 13/230,660, filed on Sep. 12, 2011, now Pat. No. 8,472,562, which is a continuation of application No. 11/545,765, filed on Oct. 10, 2006, now Pat. No. 8,040,976, which is a continuation of application No. 10/403,633, filed on Mar. 31, 2003, now Pat. No. 7,136,430.

(51) Int. Cl.
*H04L 27/00* (2006.01)
*H04B 1/00* (2006.01)

(52) U.S. Cl.
USPC .......................................... 375/324; 375/130

(58) Field of Classification Search
USPC ......... 375/324, 130, 147, 260, 316, 329, 332; 455/102, 110, 112; 341/50, 61, 143
See application file for complete search history.

(56) References Cited

U.S. PATENT DOCUMENTS

| 4,593,267 A | 6/1986 | Kuroda et al. |
| 4,949,048 A | 8/1990 | Tokumo et al. |
| 5,377,224 A | 12/1994 | Hudson |
| 5,497,152 A | 3/1996 | Wilson et al. |

(Continued)

FOREIGN PATENT DOCUMENTS

| EP | 1067674 | 1/2001 |
| EP | 1168632 | 1/2002 |

(Continued)

OTHER PUBLICATIONS

"Extended European Search Report", EP Application No. 12157021. 2, (Oct. 17, 2012), 7 pages.

(Continued)

*Primary Examiner* — Khai Tran
(74) *Attorney, Agent, or Firm* — Alin Corie; Mike Allen; Micky Minhas

(57) ABSTRACT

A receiver and method is provided for sigma-delta converting an RF signal to a digital signal and downconverting to a digital baseband signal. The RF signal is split into N phases, as can be accomplished using a sample and hold circuit, and each phase is digitized, as can be accomplished using an analog-to-digital (A/D) sigma-delta converter. Polyphase decimation techniques and demodulation are applied to the phased signals to generate a demodulated digital signal. The demodulated digital signal is further downconverted to the appropriate baseband signal.

20 Claims, 5 Drawing Sheets

(56) References Cited

U.S. PATENT DOCUMENTS

| | | |
|---|---|---|
| 5,552,785 A | 9/1996 | Wilson et al. |
| 5,881,107 A | 3/1999 | Termerinac et al. |
| 5,945,885 A | 8/1999 | Schwartz et al. |
| 5,987,071 A | 11/1999 | Iwamatsu et al. |
| 6,038,248 A | 3/2000 | Rabaeijs et al. |
| 6,061,008 A | 5/2000 | Abbey |
| 6,133,871 A | 10/2000 | Krasner |
| 6,621,366 B1 | 9/2003 | Gentile |
| 6,642,874 B1 | 11/2003 | Lin et al. |
| 6,678,340 B1 | 1/2004 | Khlat et al. |
| 6,710,650 B1 | 3/2004 | Beaudin et al. |
| 6,734,725 B2 | 5/2004 | Masuda et al. |
| 7,110,732 B2 | 9/2006 | Mostafa et al. |
| 7,145,972 B2 | 12/2006 | Kumar et al. |
| 7,149,261 B2 | 12/2006 | Smith |
| 7,245,237 B2 | 7/2007 | Lopez-Estrada |
| 7,283,076 B1 * | 10/2007 | Ding et al. .................... 341/143 |
| 8,472,562 B2 | 6/2013 | Morris et al. |
| 2001/0040930 A1 | 11/2001 | Abbey |
| 2002/0176522 A1 | 11/2002 | Fan |
| 2002/0181614 A1 | 12/2002 | Mostafa et al. |
| 2004/0239416 A1 | 12/2004 | Smiley et al. |
| 2005/0062526 A1 | 3/2005 | Morris et al. |
| 2012/0063548 A1 | 3/2012 | Morris et al. |

FOREIGN PATENT DOCUMENTS

| | | |
|---|---|---|
| EP | 2523354 | 11/2012 |
| WO | WO-9820657 | 5/1998 |
| WO | WO-0069085 | 11/2000 |
| WO | WO-02056487 | 7/2002 |

OTHER PUBLICATIONS

"Final Office Action", U.S. Appl. No. 11/545,765, (Mar. 25, 2010), 6 pages.

"Final Office Action", U.S. Appl. No. 11/545,765, (Jun. 6, 2008), 8 pages.

"Foreign Office Action", EP Application No. 04724656.6, (Apr. 15, 2011), 4 pages.

"International Search Report and Written Opinion", Application No. PCT/IB2004/000967, (Jul. 20, 2004), 8 pages.

"Non-Final Office Action", U.S. Appl. No. 11/545,765, (Aug. 27, 2009), 8 pages.

"Non-Final Office Action", U.S. Appl. No. 11/545,765, (Oct. 15, 2007), 10 pages.

"Non-Final Office Action", U.S. Appl. No. 13/230,660, (Jul. 17, 2012), 6 pages.

"Notice of Allowance", U.S. Appl. No. 11/545,765, (Jun. 10, 2011), 7 pages.

"Notice of Allowance", U.S. Appl. No. 10/403,633, (Jul. 10, 2006), 7 pages.

"Notice of Allowance", U.S. Appl. No. 13/230,660, (Feb. 22, 2013), 7 pages.

Aziz, P et al., "An Overview of Sigma-Delta Converters: How a 1-Bit ADC Achieves More Than 16-Bit Resolution", *IEEE Signal Processing Magazine*, vol. 13, Issue 1, (Jan. 1996), pp. 61-84.

Centuori, Alfonso et al., "A 320-MHz Four-Paths Bandpass Sigma-Delta Modulator", *IEEE Instrumentation and Measurement Technology Conference*, Anchorage, Alaska, USA, (May 23, 2002), pp. 497-500.

"Intention to Grant", European Patent Application No. 04724656.6, Jun. 20, 2013, 6 pages.

\* cited by examiner

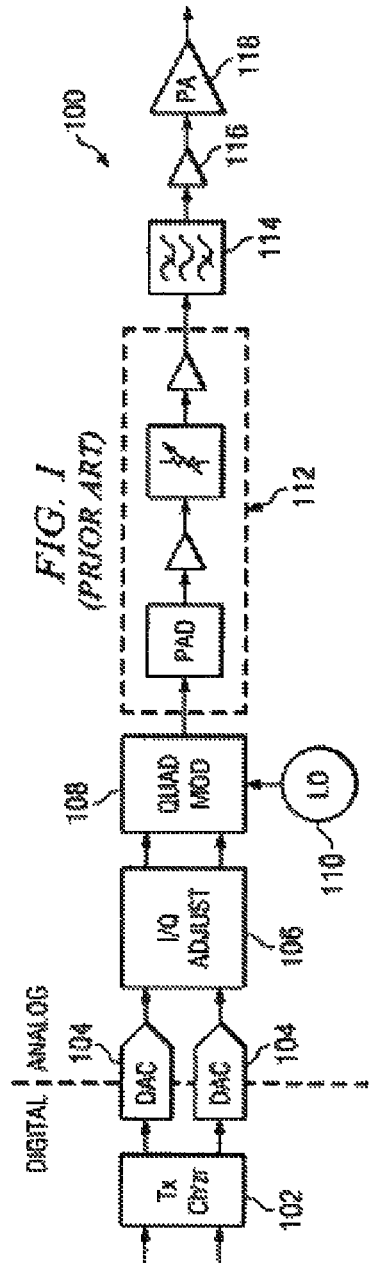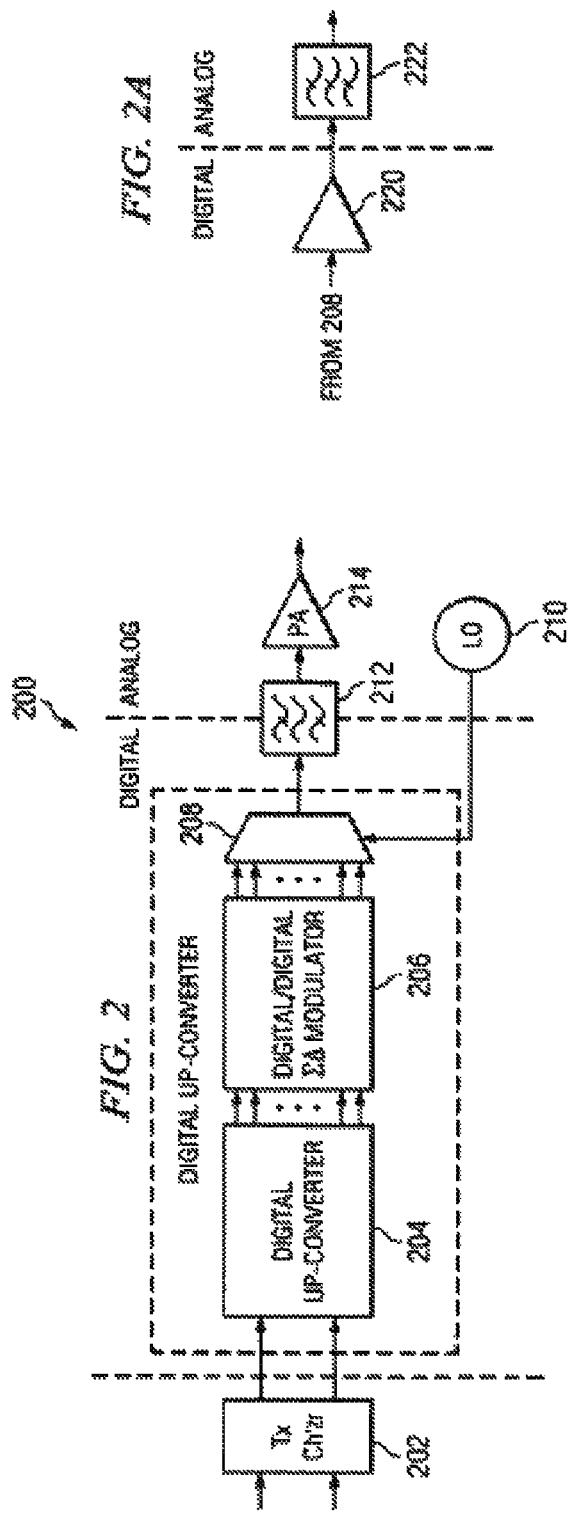

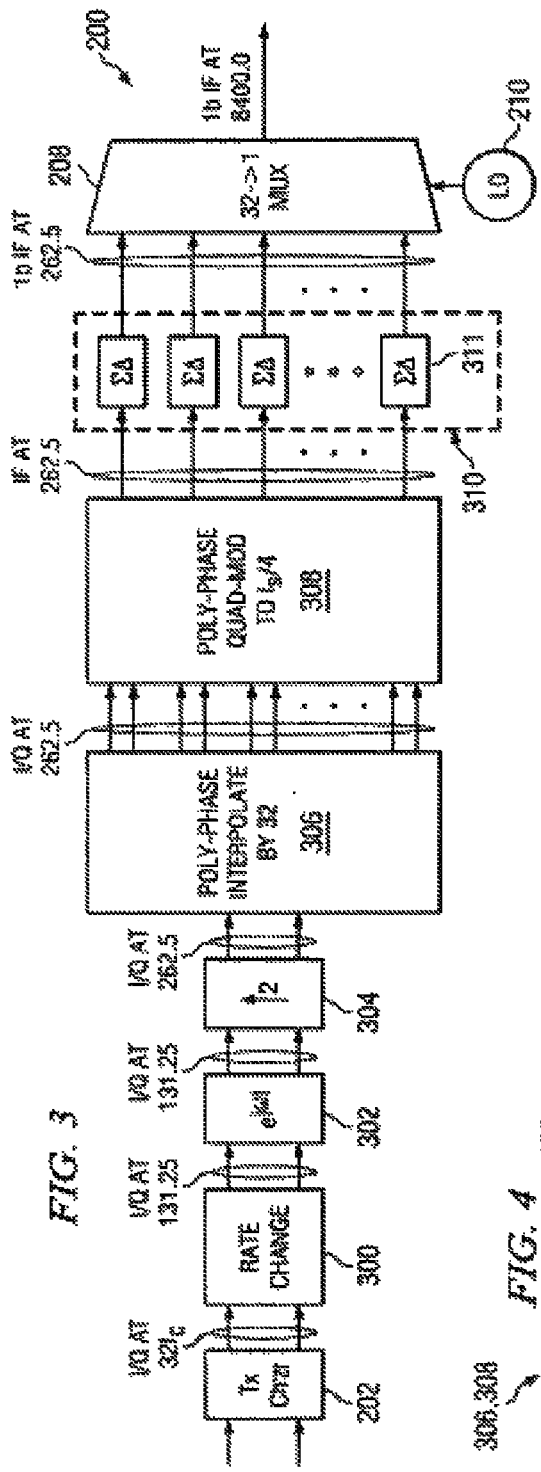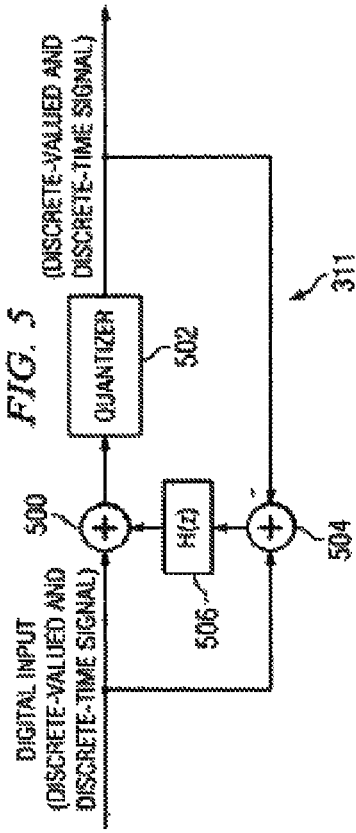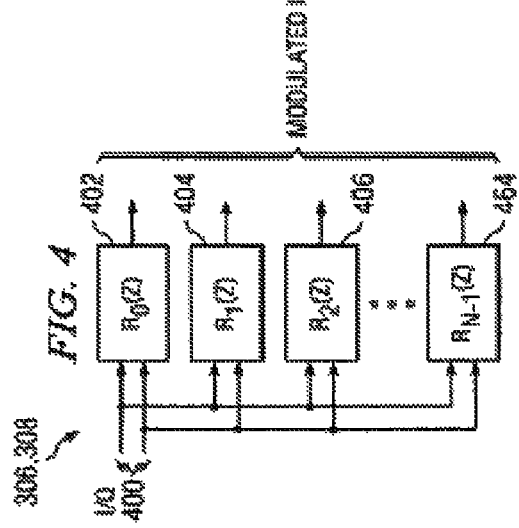

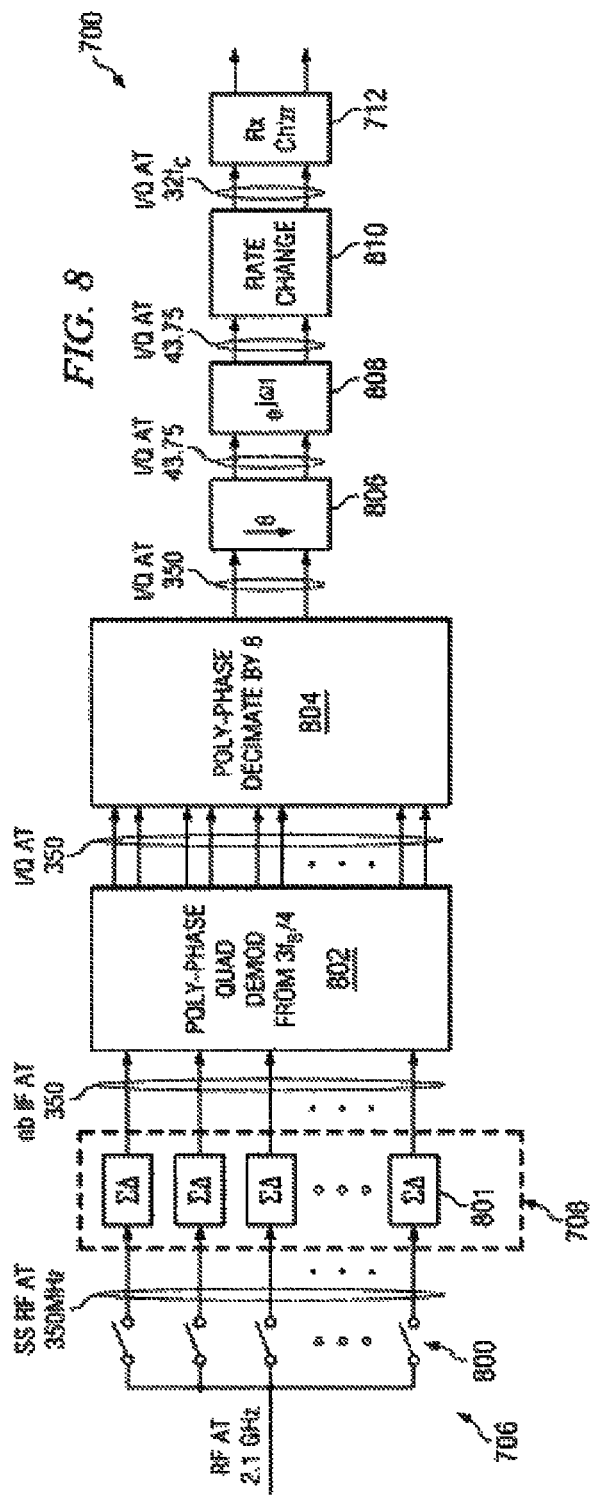

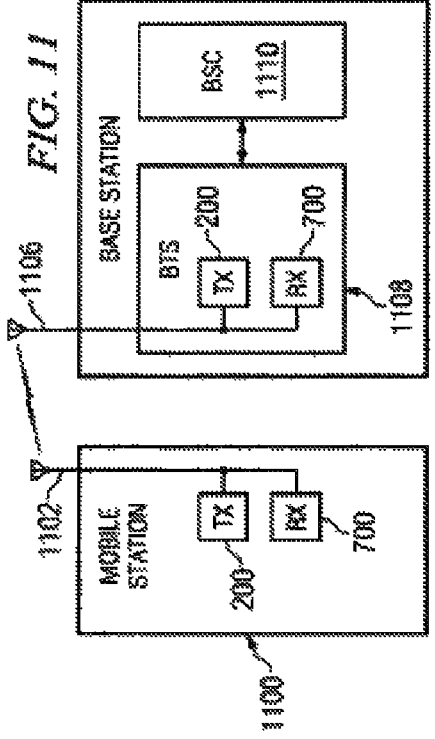
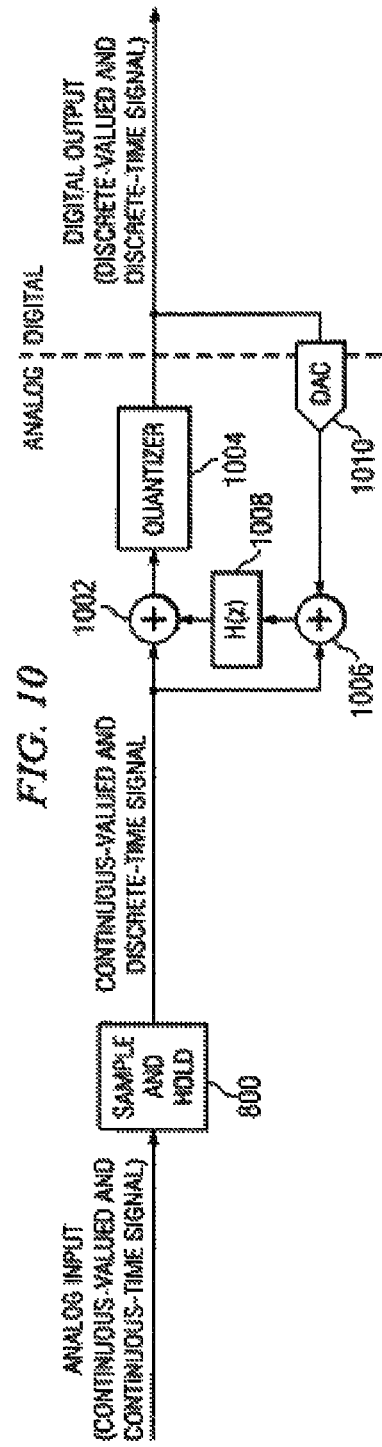
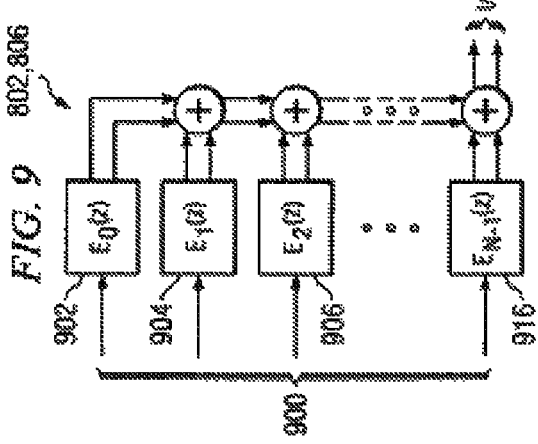

DIGITAL RECEIVER

PRIORITY

This application is a continuation and claims priority under 35 U.S.C. §120 to U.S. patent application Ser. No. 13/230,660, filed Sep. 12, 2011, which is a continuation of and claims priority to U.S. application Ser. No. 11/545,765, filed Oct. 10, 2006, which is a continuation of and claims priority to U.S. application Ser. No. 10/403,633, filed Mar. 31, 2003. This application is related to another commonly owned U.S. application Ser. No. 10/403,727, filed Mar. 31, 2003. The contents of the prior applications are incorporated herein by reference in their entirety.

BACKGROUND

In current digital wireless systems, the traditional up-conversion chain (or significant portion thereof) is primarily analog and includes types such as super-heterodyne, low intermediate frequency (IF) and zero IF up-conversion technology. These technologies start with the conversion of inherently digital signals to analog signals through high performance digital-to-analog (D/A) converters, generally due to the higher frequencies involved. Once converted to the analog domain, various combinations of analog filters, amplifiers, mixers and modulators (and perhaps other analog elements) are cascaded to achieve the up-conversion from the output of the A/D converter(s) to the radio frequency (RF) band of interest (transmit RF signal).

Likewise, on the receiver side, the traditional down-conversion chain (or significant portion thereof) is primarily analog including such types as super-heterodyne, low IF and zero IF down-conversion technology. To achieve the down-conversion, various combinations of analog filters, amplifiers, mixers and demodulators (and perhaps other analog elements) are utilized to achieve the conversion from the RF band of interest (receive RF signal) to the input to A/D converter(s).

Component variation, tolerances, and aging all affect the design requirements, costs, and manufacturability of the analog up-conversion (transmitter) and down-conversion (receiver) chains. Accordingly, there is needed a digital transmitter and digital receiver that utilizes digital technology for the up-conversion and down-conversion chains.

SUMMARY

According to one or more embodiments, there is provided a receiver having circuitry for receiving and separating a radio frequency (RF) signal into a plurality of parallel analog signals. An analog-to-digital (A/D) sigma delta converter receives the plurality of parallel analog signals and generates a plurality of parallel digital signals. A digital downconverter receives and demodulate the parallel digital signals and generates a combined digital signal having a first rate and downconverts the digital signal to a baseband digital signal having a second rate.

In another embodiment, there is provided a method of downconverting a received analog signal for data recovery. An RF signal is separated into a plurality of phased analog signals which are analog-to-digital sigma delta converted to generate a plurality of phased digital signals. The plurality of phased digital signals are combined into a digital signal having a first rate and downconverted to a downconverted digital signal having a second rate.

According to yet another embodiment, there is provided a wireless communications device having an antenna for receiving a radio frequency (RF) signal and a receiver. The receiver includes circuitry for receiving and separating a radio frequency (RF) signal into a plurality of parallel analog signals, an analog-to-digital (A/D) sigma delta converter for receiving the plurality of parallel analog signals and generating a plurality of parallel digital signals, and a digital downconverter for receiving and demodulating the parallel digital signals and generating a combined digital signal having a first rate and downconverts the digital signal to a baseband digital signal having a second rate.

BRIEF DESCRIPTION OF THE DRAWINGS

For a more complete understanding of the described embodiments, reference is now made to the following descriptions taken in conjunction with the accompanying drawings, wherein like numbers designate like objects, and in which:

FIG. 1 is a block diagram of a prior art analog transmitter;

FIG. 2 is a block diagram of an example digital transmitter in accordance with one or more embodiments;

FIG. 2A is a block diagram of an alternative embodiment of a portion of the digital transmitter in accordance with one or more embodiments;

FIG. 3 is a detailed block diagram of the digital transmitter shown in FIG. 2;

FIG. 4 illustrates the polyphase interpolate by N and digital quadrature modulator of FIG. 3;

FIG. 5 is a detailed block diagram of an example sigma-delta modulator shown in FIG. 3 in accordance with one or more embodiments;

FIG. 8 is a detailed block diagram of the digital receiver shown in FIG. 7;

FIG. 9 illustrates the digital quadrature demodulator and polyphase decimate by N of FIG. 8;

FIG. 10 is a detailed block diagram of an example sigma-delta A/D converter shown in FIG. 8; and FIG. 11 is a block diagram of an example wireless communications network, including communication devices incorporating the transmitter and/or receiver in accordance with one or more embodiments.

DETAILED DESCRIPTION

Digital Transmitter

Figure 6:
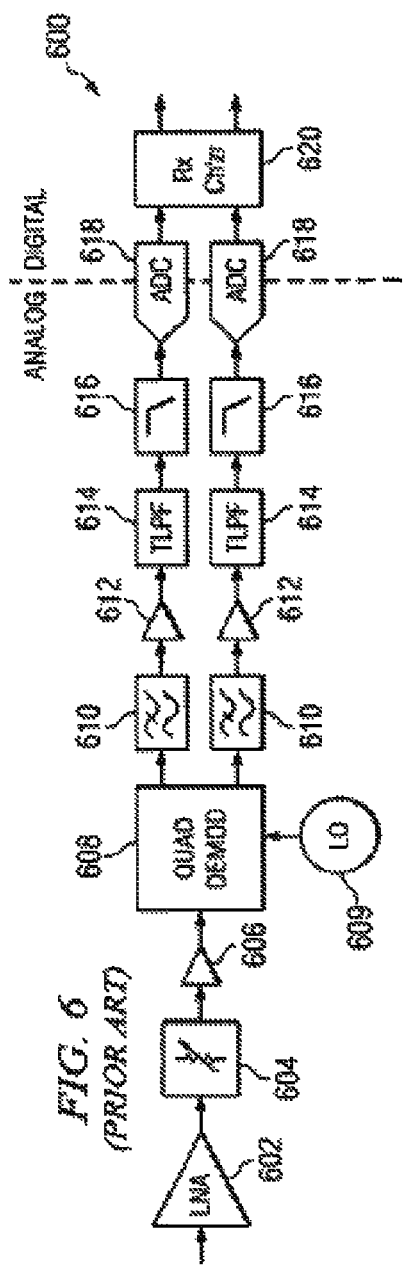
FIG. 6 is a block diagram of a prior art analog receiver.

With reference to FIG. 1, there is shown a relevant portion of a prior art analog transmitter 100 of the type used in conventional digital communications systems. The transmitter 100 includes a transmit channelizer 102 receiving coded I and Q digital baseband signal inputs. The I and Q digital inputs each typically comprise a stream of samples (or chips) representing a digital value, or word having n bits. The sample rate (or chip rate) of the I and Q inputs to the channelizer 102 is determined in accordance with the technology and/or standard utilized (e.g., CDMA(IS-95) is 1.2288 Mcps, UMTS is 3.84 Mcps, etc.).

As will be appreciated, the processing, generation and functionality utilized to generate the I and Q digital signals that are input to the channelizer 102 are not shown or described. This is known to those of ordinary skill in the art. In general terms, the digital data is processed by encoding, interleaving, converting, and spreading (using orthogonal codes and psuedo-random (PN codes)) to generate the I and Q digital baseband signals (often referred to as samples at a particular sampling rate).

It will be understood that the modulation and/or coding scheme utilized herein is not limited to quadrature (I and Q) modulation or coding, and other modulation or coding techniques may be utilized with modifications to the described embodiments. In addition, the I and Q signals may relate to a single carrier or multiple (1 to N) carriers.

The transmit channelizer 102 receives baseband information in the form of I and Q digital samples (having n bits per sample) and tunes, combines, and up-converts the signals to a higher sampling frequency (or rate), usually thirty-two times the chip frequency (32 Fc). The channelizer 102 may also process the signals relative to pulse shaping, power control and peak power reduction, etc. The I and Q digital signals output from the channelizer 102 are input to digital-to-analog converters 104 to generate I and Q analog signals. Prior to input to an analog quadrature modulator 108, the I and Q analog signals are processed by an I/Q adjustment block 106 that performs filtering functions to remove any undesirable signal images and/or imperfections caused by the digital-to-analog conversion process.

The analog quadrature modulator 108 receives the I and Q analog signals and uses them to modulate an RF carrier signal (in-phase carrier and quadrature carrier (ninety degrees out of phase)) generated from a local oscillator (LO) 110 to output a combined and modulated RF carrier signal. The frequency of the RF carrier is determined in accordance with the desired carrier frequency designated by the technology, standard and/or allocated frequency spectrum (e.g., ranges around 850 MHz (IS-95), 1.9 GHz (PCS), 2.1 GHz (UMTS), etc.).

The modulated RF carrier output from the quadrature modulator 108 is further processed with analog amplifier/attenuation/filter elements 112 which may include amplification, attenuation, and filtering functionality as desired (not shown in detail). The output from the analog elements 112 is input to a bandpass filter 114 that eliminates any spurious signals outside the RF band of interest (RF carrier bandwidth or allocation bandwidth for a multi-carrier transmitter). A pre-amplifier 116 amplifies the bandpass-filtered modulated RF carrier signal for input to the power amplifier 118 and eventual output to a transmit antenna (not shown).

With reference to FIG. 2, there is shown a block diagram of an example digital transmitter 200 in accordance with one or more embodiments. The digital transmitter 200 includes a transmit channelizer 202, that is the same or similar to the transmit channelizer 102 shown in the prior art analog transmitter 100 of FIG. 1. The I and Q digital signals may be those associated with a single communications channel (or single user, e.g., communications signal transmitted from a wireless subscriber handset), a group of communications channels (or multiple users, e.g., communications signals transmitted from a base station, or multiple subscriber or data channels). In addition, the transmitter 200 may support single or multiple carriers and multiple standards. As will be appreciated, the term digital baseband signals may refer to the inputs to the channelizer 202 and/or the outputs of the channelizer 202 (and any intermediate digital signals in the upconversion and modulation process prior to achieving the modulated intermediate frequency (IF) signals). Accordingly, it will be understood that the digital up-converter (described below) may also include the channelizer 202.

The I and Q digital outputs of the transmit channelizer 202 are input to a digital up-converter 204 having its output (modulated digital IF signals) thereof input to a digital (digital-to-digital) sigma-delta modulator 206. The outputs of the digital sigma-delta modulator 206 are input to a high speed digital multiplexer 208. A local oscillator (LO) 210 generates a local oscillator or clocking signal at a desired frequency (usually a multiple of the carrier frequency) to multiplex the signals input to the multiplexer 208. The output of the multiplexer 208 is a single bit stream output that is filtered by a bandpass filter 212 that converts the bit stream to analog format and further processes the signal (as described below). The output signal is then input to a power amplifier 214 and forwarded to an antenna (not shown) for transmission.

With reference to FIG. 2A, there is shown a block diagram of an alternative embodiment of a portion of the digital transmitter 200 in accordance with one or more embodiments. In this embodiment, the output of the multiplexer 208 is a single bit stream output that is input to a switching amplifier 220 whose output is filtered by a bandpass filter 222. The signal output from the bandpass filter is then forwarded to an antenna (not shown) for transmission. Additional embodiments may be utilized, and are not limited to the structures and methods of signal transmission, filtering, and power amplification shown in FIGS. 2 and 2A (i.e., subsequent processing to the output from the digital multiplexer 208). It will be understood that the output of the multiplexer 208 is described as a single bit stream output, however, this may alternatively be multi-bit outputs and/or multiple bit streams. The signal configuration may also apply to the output of the switching amplifier 220.

In general terms, by using multi-rate signal processing techniques, the digital baseband signal can be effectively up-sampled (or up-converted) to a sample rate that is greater than the desired carrier frequency in N phases (e.g., a polyphase filter where each phase operates at 4/n times the carrier frequency (or the target sampling rate) divided by N). In the example embodiment of the digital transmitter described below, the sample rate is four times the desired carrier frequency. One example embodiment will be advantageously described hereafter using an example where the carrier frequency is 2.1 GHz, the sample rate is 8.4 Gsamples/sec, N=32, and thus each phase N would operate at 262.5 Msamples/sec). As will be understood, other examples, variations, and embodiments are possible. Once the N phases are generated (both I and Q), a polyphase digital quadrature modulator programmed to a center frequency equal to the desired carrier frequency modulates the signals.

The functionality of the digital quadrature modulator may be obtained with relatively simple components, elements or means (such as a multiplexer, inverters and control logic, not shown, either hardware or software) when the target carrier frequency=n*sample rate/4. Within this equation, n is an integer, and is preferably odd. In the example to be described more fully below, where n=1, if N is divisible by four then the quadrature modulator may be implemented with no additional hardware and its functionality can be obtained by modifying the polyphase filter coefficients (of the polyphase interpolate by N element).

The next stage is a digital-to-digital sigma-delta modulator that converts the multi-bit polyphase outputs to a set noise-shaped single bit outputs. A high speed digital multiplexer converts the N parallel bit streams into a single bit stream at N times the input sampling rate (or four times the desired carrier frequency). This signal is applied to an RF bandpass analog reconstruction filter (such as an RF surface acoustic wave (SAW) filter) to select the image at the desired carrier frequency and remove the sample images and the sigma-delta modulator shaped noise. Then, the signal is applied to the power amplifier. As will be appreciated, the bandpass filter may optionally be placed after a switching amplifier (as shown in FIG. 2A) to achieve a higher level of efficiency. It will be understood that the outputs of the modulator and multiplexer are described as single bit outputs and a single bit stream, however, these may alternatively be multi-bit outputs and/or multiple bit streams.

Multi-rate digital signal processing involves changes of the sampling rates as part of the signal processing. Changing a signal from given sample rate to a different sample rate is called sampling rate conversion. The basic operations in "multi-rate" signal processing are decimation (decrease the sampling rate), interpolation (increase the sampling rate) or resampling (combination of decimation and interpolation to change the sampling rate by a fractional value, such as ⅘ or 1.5). Decimation usually involves lowpass filtering (FIR or IIR filters) followed by downsampling, while interpolation usually involves upsampling (referred to as "zero stuffing") followed by lowpass filtering (FIR filter). Multi-rate signal processing and these operations are well-known to those skilled in the art.

Now with reference to FIG. 3, there is shown a more detailed block diagram of the digital transmitter 200 in accordance with one or more embodiments. The digital transmitter 200 includes the transmit channelizer 202 (as described above). The output of the channelizer 202 includes I and Q digital signals (each sample having one or more bits) at a sampling rate or frequency that is a multiple of the chip frequency (fc), and in this particular embodiment, the rate or frequency is thirty-two times the chip frequency (for example, if CDMA modulation were utilized under IS-95, the chip frequency would be 1.2288 Msps and the output of the transmit channelizer 202 would be 39.3216 Msps).

A rate change element 300 changes the sampling rate of the I and Q digital signal outputs of the channelizer 202 to a rate that is a sub-multiple of the final sampling rate (in the example embodiment the target sample rate is 8.4 Gsps). The I and Q digital signals (at 131.25 Msps) are input to a complex channel tuner 302. The complex channel tuner 302 places the carrier or carriers within a certain sub-band of a particular band, as desired. The complex tuner 302 when combined with sufficient bandwidth of the digital-to-digital sigma-delta modulator allows entirely digital tuning within a band. As will be appreciated, the tuner 302 is optional and may or may not be included within the transmitter 200. If not included, a tunable LO and additional filters may be desirable. The I and Q digital signals are then input to an interpolator (by factor 2) 304 that increases (upconverts) the sampling rate of the I and Q digital signals from 131.25 Msps to 262.5 Msps.

The I and Q signals (at 262.5 Msps) are received by a polyphase interpolator 306 that separates each of the I and Q digital signals into N phases, with each phase operating at the same frequency or rate as the input signals. In this example embodiment, the polyphase interpolator 306 interpolates by a factor of thirty-two (N=32) such that thirty-two pairs (of I and Q digital signals) are generated, referred to as phases or filter phases. This effectively functions as an interpolator with a factor of thirty-two. As will be appreciated, different modulation techniques may be utilized such that there may exist one or more signals for each phase.

In a standard interpolator (i.e., non-polyphase), the input signal (low sampling rate) is upsampled (usually by zero stuffing) followed by an interpolation filter (at the higher sampling rate). As such, the filtering that occurs at the higher rate is computationally intensive. Normally, the filter that is utilized is a digital finite impulse response (FIR) filter (a digital infinite impulse response (IIR) filter may be used, but it is more common to utilize FIR filters). Digital FIR (and IIR) filters and methods are known to those skilled in the art.

In order to reduce the significant processing requirements of standard interpolators, designers often use a technique known as polyphase decomposition. The fundamental idea behind polyphase decomposition is the partitioning of the filter operating at the high sample rate into a number of smaller filters operating at the lower sampling rate. Each of the smaller filters is referred to as a "subfilter" or "filter phase". Each subfilter uses only a subset of the coefficients of the high sample rate filter (such decomposition also applies to decimation).

In general terms, polyphase interpolation architecture includes the partitioning of the input single into L phases (where L is the interpolation factor). The L inputs are filtered using the L different "subfilters" or "filter phases" derived from the original overall filter. The total number T of taps for the overall FIR filter should usually be a multiple of L, and generally the number of taps per subfilter is three or more. However, any number of taps may be used to provide the desired filtering function. The coefficients of each subfilter are determined by skipping every Lth coefficient, starting at coefficients zero through L−1. In the standard polyphase interpolator, the constituent L phase outputs are recombined to generate the output at the higher sampling rate (L times the input sampling rate).

The polyphase interpolator 306 differs from the standard polyphase interpolator in that the constituent I and Q phases are not recombined. The phases are maintained as separate parallel paths that are used as inputs to a polyphase quadrature modulator 308. This approach allows for lower sampling rates to be utilized until the final output function, and allowing more efficient implementation of the function.

The quadrature modulator 308 converts (modulates and combines) the I and Q signals (each of the N phases, in the example embodiment, N corresponds to L) to a modulated intermediate frequency (IF) signal or signals. In a standard approach, a quadrature oscillator signal output (not shown) is used to multiply the in-phase (I) and quadrature phase (Q) signals to generate a modulated IF signal. In the digital domain, if the relationship between the IF and oscillator signal is chosen such that the target carrier frequency=$nF_s/4$, where n is odd, then the samples of the oscillator signal represent only one of three states: 1, 0 −1. In other words, if the sampling of the sine wave (in-phase) and cosine wave (quadrature) is chosen at four times the frequency of the sine and cosine waves, then there would exist only these three distinct values. This technique is known in the art and reduces the complexity of a digital quadrature modulator. The resulting sample stream for the sine (or cosine) wave is repetitive with period of four, e.g., 0, 1, 0, −1, 0, 1, 0, −1, 0, 1, 0, −1, etc.

By selecting a polyphase filter with the number N of subfilters to be a multiple of 4 phases (e.g., 4, 8, 16, 32, etc.), the samples from the digital quadrature modulator 308 will have the same multiplier in a given phase. For example, only showing the first four phases, the sine wave samples are:

phase zero: 0, 0, 0, 0, 0, . . .
phase one: 1, 1, 1, 1, 1, . . .
phase two: 0, 0, 0, 0, 0, . . .
phase three: −1, −1, −1, −1, −1, . . . and the cosine wave samples are:
phase zero: 1, 1, 1, 1, 1, . . .
phase one: 0, 0, 0, 0, 0, . . .
phase two: −1, −1, −1, −1, −1, . . .
phase three: 0, 0, 0, 0, 0, . . .

Reflecting the target carrier frequency=$nF_s/4$ sampled quadrature modulator into the phase filters effectively causes either the I or Q branch to go to zero (for that particular pair) and thus the IQ signal is converted into a single stream of modulated IF data. As will be appreciated for the four phases shown above, the modulated IF signal for each phase will be +I, +Q, −I, −Q, respectively. Therefore, the digital quadrature modulator 308 may be constructed using only the subfilters or filter phases of the polyphase interpolator 306 (i.e., the polyphase filter) by changing the filter coefficients of the subfilters. Using this approach reduces or eliminates any physical elements or functions necessary to implement the digital quadrature modulator 308 (other than modifying the coefficients of the subfilters or discarding certain signal stream(s)).

Now referring to FIG. 4, there is illustrated in more detail the combination of the polyphase interpolator 306 and digital quadrature modulator 308 shown in FIG. 3, in essence illustrating a polyphase filter. The I and Q digital baseband signals 400 are input to the polyphase filter having N number of subfilters or filter phases, identified by reference numerals 402 thru 464, with subfilters 408 thru 462 not shown. In the example embodiment shown, N=32 and therefore there are thirty-two subfilters as illustrated. Unlike a standard polyphase interpolator, the polyphase interpolator 306 does not recombine the outputs of the subfilters 402-464.

Each subfilter 402-464 has a specific transfer function $R_i(z)$. The transfer function depends on the coefficients and structure of the overall digital FIR polyphase filter (this filter may also be an IIR or other type of filter, though FIRs are more common). For example, assuming the overall digital FIR polyphase filter (interpolator) is designed with 256 taps, each subfilter would have eight coefficients (every Nth coefficient of the 256). Therefore, for each of the N (32) paths (I and Q), each subfilter applies its respective coefficients to eight consecutive samples in its respective path. As was described above, the quadrature modulator 308 may be implemented by modifying the coefficients of the subfilters 402-464.

Now referring back to FIG. 3, the output of the combination of the interpolator 306 and quadrature modulator 308 comprises N outputs at the input sampling rate (i.e., thirty-two outputs each at a sample rate of 262.5 Msps). These outputs are input to a digital-to-digital sigma-delta modulator 310. In one embodiment, the sigma-delta modulator 310 is constructed or configured as a single unit with multiple inputs/outputs. As will be appreciated, the sigma-delta modulator 310 may be constructed with different configurations or structures as desired by one of ordinary skill in the art. In an example embodiment, the sigma-delta modulator 310 includes a bank or plurality of sigma-delta modulators 311, as shown, with each modulator 311 receiving and processing a sample stream. As described earlier, and will be appreciated, each sample is a digital word having n number of bits. The n-bit (multibit) input samples are sigma-delta modulated and converted to a single bit output (each output operating at the sample rate of 262.5 Msps). As described earlier, the outputs of the modulators 311 (or 310) may also be multi-bit.

Sigma-delta modulators are used primarily in A/D and D/A converters and provide a means of obtaining improved in-band signal-to-noise ratio performance when a quantization operation is applied. The sigma-delta structure effectively shapes the resulting quantization noise. For a general overview of Sigma-Delta Converters, see, Aziz, Pervez M. et al., "An Overview of Sigma-Delta Converter", IEEE Signal Processing Magazine, January 1996, pp. 61-84, which is incorporated herein by reference.

The digital-to-digital sigma-delta modulator 310 (or modulators 311) combine, or operate, effectively to form an "N-path" sigma-delta modulator. An N-path modulator comprises N identical internal sigma-delta modulators operating in parallel. In such a modulator, the inputs and outputs to each internal sigma-delta modulator are demultiplexed/multiplexed such that the overall structure behaves as a single sigma-delta modulator operating at N times the operating rate of each of the internal converters. In one or more embodiments, the input data streams are already effectively demultiplexed by the polyphase filters of the interpolator 306. An advantage of this approach is that at a high operating rate (Fs) it is more practical to implement the multiple internal sigma-delta modulators running at the reduced operating rate (Fs/N) than implementing a single modulator operating at the high rate (Fs).

One important feature of an N-path configured sigma-delta modulator is the noise-shaping response. This response consists of N "images" of the noise-shaping response of the internal (and identical) sigma-delta modulators. For example, if N=4 and the input rate is 25 Mhz and output rate is 100 Mhz, there would be noise-shaping "notches" in the frequency domain positioned at 0, 25, 50, 75 and 100 MHz (assuming a low-pass modulator). The number N also corresponds to, or identifies, the number of images (and effectively the number of notches) that appear in the overall modulator response. By design, noise is suppressed the greatest in these notch locations. Therefore, for a given sampling rate (Fs), N is chosen such that a notch is positioned in the frequency band where the signal of interest will reside. The sigma-delta modulator effectively shapes the resulting quantization noise out of the RF band of interest (i.e., the carrier frequencies).

In the example embodiment, the sampling rate (carrier frequency is 2.1 GHz) is 8.4 Gsps and N=32 resulting in notch locations having multiples of 262.5 MHz (e.g., 0, 262.5, 525, . . . , 2100, . . . , 8400 Mhz).

Now referring to FIG. 5, there is illustrated a detailed block diagram of an example single digital-to-digital sigma-delta modulator 311 shown in FIG. 3 in accordance with one or more embodiments. Each sigma-delta modulator 311 includes a summation circuit 500, a quantizer 502, a difference circuit 504 and a filter circuit 506 having transfer function H(z). The summation circuit 500 sums the modulated IF input signal (in the form of a digital word having n bits) and a delayed version (filter circuit 506) of a difference signal between the IF modulated input signal and the output signal of the quantizer 502 generated by the difference circuit 504. In the example embodiment, the digital-to-digital sigma-delta modulator 311 receives a multi-bit input signal and most-significant-bit (MSB) aligns it with the single bit output that is fed back.

Now referring back to FIGS. 2, 2A and 3, the single-bit outputs of each digital-to-digital sigma-delta modulator 311 are input to a high speed digital multiplexer 208 that converts the N parallel bit streams into a single bit stream at N times the sampling rate of each parallel stream. In the example embodiment, the single bit stream rate would be 8.4 Gsps (i.e., four times the desired carrier frequency of 2.1 GHz). This signal is then applied to an analog RF bandpass reconstruction filter 212 (such as a SAW filter) to pass the image/signal at the desired carrier frequency, thus removing the sigma-delta shaped noise and any signals/images outside the RF band of interest (i.e., the desired carrier frequency). The filtered signal is then input to a standard power amplifier 214 for transmission (to the antenna, not shown). Alternatively, the configuration illustrated in FIG. 2A may be utilized.

As will be appreciated, the local oscillator 210 is used to successively select each phase (N=32) to generate the 8.4 data stream. Thus the analog local oscillator 210 running at a frequency of 8.4 GHz would be utilized. One way to implement the control signals to the multiplexer 208 is to drive a 5-bit counter with the LO signal and apply the 5-bit counter output to the multiplexer control (five mux input control signals).

The architecture provides the advantage that the final multiplexer 208 operates at the high sampling rate (Fs) by combining the multiple parallel data streams from each of the parallel paths into a single output data stream. All other digital elements of the transmitter 200 (processing the signals leading to input to multiplexer) may operate at the lower rate.

As will be appreciated, the sigma-delta modulators 311 of the example embodiment convert a multi-bit input to a single bit output. This single bit output stream (from the multiplexer 208) drives a conventional power amplifier by utilizing the analog bandpass reconstruction filter 212. An alternative embodiment shown in FIG. 2A includes a switching-type amplifier directly driven by the single bit output stream (with an analog filter subsequent to the amplifier). In another embodiment (not shown), the sigma-delta modulator outputs are multi-level and are used to drive a multi-phase switching power amplifier (where the multi-level outputs are decoded to form switching waveforms for each of the constituent phases).

Digital Receiver

With reference to FIG. 6, there is shown a relevant portion of a prior art analog receiver 600 of the type used in conventional digital communications systems. The receiver 600 receives an RF signal on a receiver antenna (not shown) for input to a low noise amplifier (LNA) 602. The amplified RF signal is filtered, attenuated and amplified again by the components identified by reference numerals 604 and 606. The frequency of the RF signal is determined in accordance with the desired carrier frequency designated by the technology, standard, and/or allocated frequency spectrum (e.g., ranges around 850 MHz (IS-95), 1.9 GHz (PCS), 2.1 GHz (UMTS), etc.).

An analog quadrature demodulator 608 receives the RF signal and demodulates the signal using in-phase and quadrature carrier signals generated from a local oscillator (LO) 609. It will be understood that the demodulation and/or decoding scheme utilized is not limited to quadrature (I and Q) demodulation or decoding, and other demodulation or decoding techniques may be utilized with modifications. In addition, the I and Q signals may relate to a single carrier or multiple (1 to N) carriers.

The demodulated I and Q analog signals are subsequently processed by low pass filters 610, amplifiers 612, tunable low pass filters 614 (functioning to select one or more carriers), and/or low pass filters 616. The demodulated I and Q analog signals are input to analog-to-digital converters 618 to generate I and Q digital signals. The I and Q digital output signals each typically comprise a stream of samples representing a digital value, or word having n bits. At this point, the I and Q digital signals are typically operating at a sampling frequency (or rate) that is usually thirty-two times the chip frequency (32Fc). A different frequency or rate for the I and Q signals output from the A/D converters 618 may be desired and/or utilized.

The demodulated I and Q digital signals (at a rate higher than the chip rate or frequency) are input to a receive channelizer 620. The receive channelizer 620 further downconverts and filters/selects the I and Q signals to generate individual channels (or carriers) of I and Q digital baseband signals. The sample rate (or chip rate or frequency) of the I and Q outputs from the receive channelizer 620 is generally determined in accordance with the technology and/or standard utilized (e.g., CDMA(IS-95) is 1.2288 Mcps, UMTS is 3.84 Mcps, or a multiple thereof, etc.). In general terms, the receive channelizer 102 receives I and Q digital samples (having n bits per sample) and tunes, downconverts, and separates the signals to a lower sampling frequency (or rate), usually equal to a multiple of the chip rate or chip frequency (Fc). The receive channelizer 620 may also process the signals to measure power or inject noise.

As will be appreciated, the processing, generation and functionality utilized to further process and recover the received data from the I and Q digital signals that are output from the receive channelizer 620 are not shown or described. This is known to those of ordinary skill in the art. In general terms, the digital data is further processed by de-spreading (using orthogonal codes and psuedo-random (PN codes)) de-interleaving, and decoding to generate the received data.

Figure 7:
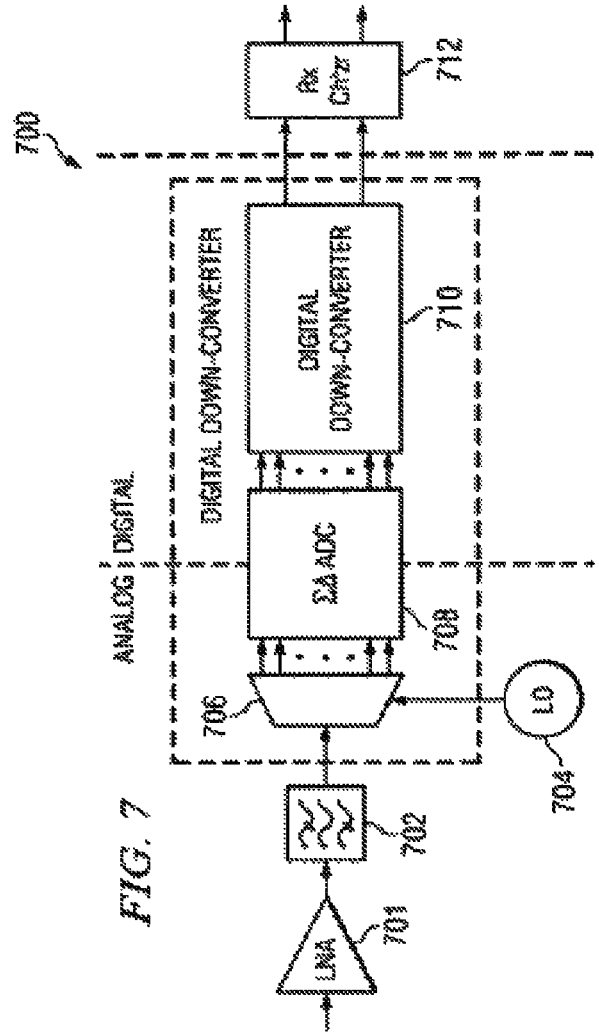
FIG. 7 is a block diagram of an example digital receiver in accordance with one or more embodiments.

With reference to FIG. 7, there is shown a block diagram of an example digital receiver 700 in accordance with one or more embodiments. The digital receiver 700 includes a receive channelizer 712, that is the same or similar to the receive channelizer 620 shown in the prior art analog receiver 600 of FIG. 6. The I and Q digital signals (or other types of signals, depending on the modulation scheme utilized) may be those associated with a single communications channel (or single user, e.g., communications signal transmitted from a wireless subscriber handset), a group of communications channels (or multiple users, e.g., communications signals transmitted from a base station, or multiple subscriber or data channels). In addition, the receiver 700 may support single or multiple carriers and multiple standards. As will be appreciated, the term digital baseband signals may refer to the outputs from the channelizer 712 and/or the inputs to the channelizer 712 (and any intermediate digital signals in the downconversion process after demodulation of the intermediate frequency (IF) signals). Accordingly, it will be understood that the digital down-converter (described below) may also include the channelizer 712.

The I and Q digital signals utilized as inputs to the receive channelizer 712 are output from a digital down-converter 710 having its input thereof output from an analog-to-digital (A/D) sigma-delta converter 708. The inputs to the A/D sigma-delta converter 708 are generated by a phased sample and hold circuit 706. A local oscillator (LO) 704 generates a local clocking signal operating at a desired frequency (usually a multiple of the desired carrier frequency) to provide control and timing of the phased sample and hold circuit 706 to further process an input RF signal. The input to the phased sample and hold circuit 706 is a single (amplified) RF signal that is filtered by a bandpass filter 702. The amplified RF signal is generated by a low noise amplifier (LNA) 701 that has received the RF signal from an antenna (not shown).

By using multi-rate signal processing techniques, the received RF signal can be effectively digitized and down-sampled (or down-converted) to IF and baseband by dividing the signal into N phases. In the example embodiment of the receiver described below, the input sample rate is $4/3$ the desired carrier frequency (of the received RF signal) and the parallel branch sample rate is one-eighth the input sample rate. One example embodiment will be advantageously described hereafter using an example where the sample rate is 2.8 Gsps, N=8, and thus each phase N would operate at 350 Gsps. As will be understood, other examples, variations, and embodiments are possible. Once the N phases are generated, a polyphase digital quadrature demodulator programmed to a center frequency equal to the desired carrier frequency demodulates the signals into the respective I and Q component signals.

The functionality of the digital demodulator may be obtained with relatively simple components, elements or means (not shown, either hardware or software) when the target carrier frequency=n*sample rate/4. In the example to be described more fully below, where n=3, if N is divisible by four then the quadrature demodulator may be implemented with no additional hardware and its functionality can be obtained by modifying the polyphase filter coefficients (of the polyphase decimate by N element).

The prior stage or element is an A/D sigma-delta converter 708 that converts the phased inputs to a set of multi-bit outputs (i.e., polyphase conversion). The polyphase A/D sigma-delta conversion digitizes signals in multiple bands or phases (N=8, in this example). As will be appreciated, digitization may cause aliasing, therefore, it may be advantageous to include RF bandpass filters (such as a SAW type filter) prior to input to the A/D sigma-delta converter 708. After digitization, the signals are digitally processed to perform demodulation, decimation and filtering, channel tuning, rate conversion, etc.

Now with reference to FIG. 8, there is shown a more detailed block diagram of the example digital receiver 700 in accordance with one or more embodiments. The digital receiver 700 includes the receive channelizer 712 (as described above). The input to the channelizer 712 includes I and Q digital signals (each sample having n bits) at a sampling rate or frequency that is a multiple of the chip frequency (fc), and in this particular embodiment, the rate or frequency is thirty-two times the chip frequency (for example, if CDMA modulation were utilized under IS-95, the chip frequency would be 1.2288 Msps and the input of the receive channelizer 712 would be 39.3216 Msps).

A rate change element 810 changes the sampling rate of I and Q digital signals that are input to the rate change element 810 to generate outputs (to the channelizer 712) at thirty-two times the chip frequency or rate. The I and Q digital signals input to the rate change element 810 have a frequency or rate that is a sub-multiple of the target sampling rate or frequency (in the example embodiment, the target sample rate is 2.8 Gsps). The I and Q digital signals (shown at 43.75 Msps) are received from a complex channel tuner 808. The complex channel tuner 808 places the desired carrier or carriers within a certain sub-band of a particular band, as desired. The complex tuner 808 when combined with sufficient bandwidth of the A/D sigma-delta converter allows entirely digital tuning within a band. As will be appreciated, the tuner 808 is optional and may or may not be included within the receiver 700. The I and Q digital signals received by the tuner 808 are generated by a decimator 806 (by factor 8) that decreases (downconverts) the sampling rate of the I and Q digital signals from 350 Msps to 43.75 Msps.

The I and Q signals (at 350 Msps) input to the decimator 806 are received from a polyphase decimator 804 that combines the N phases of the I and Q digital signals into single I and Q digital signals. The polyphase decimator 804 utilizes the decomposition technique (as described previously). Each input phase to the decimator 804 operates at the same frequency or rate as the output signals to the decimator 804. In this example embodiment, the polyphase decimator 804 decimates by a factor of eight (N=8) such that eight pairs (of I and Q digital signals) are received, each referred to as a phase. This effectively functions as a decimator with a factor of eight. As will be appreciated, different modulation techniques may be utilized such that there may exist one or more signals for each phase.

In a standard decimator (i.e., non-polyphase), the input signal (high sampling rate) is filtered (filtering at the higher sampling rate) followed by downsampling. As such, the filtering that occurs at the higher rate is computationally intensive. Normally, FIR and/or IIR digital filters are utilized, with FIR filters being the most commonly used. Digital FIR (and IIR) filters and methods are known to those skilled in the art.

As discussed previously, polyphase techniques partition the filter operating at the high sample rate into number of smaller filters operating at the lower sampling rate. The polyphase decimation architecture includes the combining (of the already partitioned input signals) of the input signals from M time-delayed phases (where M is the decimation factor).

Each time-delayed phase is input to a digital FIR filter having T taps and coefficients (of an overall FIR filter). The M inputs are filtered using M different "subfilters" or "filter phases" derived from the original overall filter. The total number T of taps for the overall FIR filter should usually be a multiple of M, and generally the number of taps per subfilter is three or more. However, any number of taps may be used to provide the desired filtering function. The coefficients of each subfilter are determined by skipping every Mth coefficient, starting at coefficients zero through M−1.

In the standard polyphase decimator, the input signal is time-delayed to generate the constituent M phase inputs, which are then filtered at the lower sampling rate of 1/M times the input sampling rate, and recombined to generate the output at the lower sampling rate.

The polyphase decimator 804 differs from the standard polyphase decimator in that the input signals are already divided into the constituent M phases, thus no time delayed signals are generated at the input of the decimator 804. These phases are maintained as separate parallel paths as output from a polyphase quadrature demodulator 802. This approach allows for lower sampling rates to be utilized in the digital portion of the receiver 700.

The polyphase quadrature demodulator 802 demodulates and separates (i.e., converts) the digitized and phased RF signals (each of the M phases), referred to as the modulated digital IF signals, to I and Q signals (per phase). In the example embodiment, N corresponds to M. In the standard approach, quadrature oscillator signal outputs (not shown) are used to multiply the RF signal to generate the in-phase (I) and quadrature phase (Q) demodulated signals. In the digital domain, if the relationship between the target carrier frequency and oscillator signal is chosen such that the target carrier frequency=nFs/4, where n is odd, then the samples of the oscillator signal represent only one of three states: 1, 0 −1. This has been described previosly with respect to the transmitter. By selecting a polyphase filter with the number N of subfilters (or phases) to be a multiple of 4 phases (e.g., 4, 8, 16, 32, etc.), the samples from the digital quadrature modulator 308 will have the same multiplier in a given phase.

Therefore, the digital quadrature demodulator 802 may be constructed using only the subfilters or filter phases (i.e., FIR subfilters) of the polyphase decimator 804 by changing the filter coefficients of the subfilters. Using this approach reduces or eliminates any physical elements or functions necessary to implement the digital quadrature demodulator 802 (other than modifying the coefficients of the subfilters).

Now referring to FIG. 9, there is illustrated in more detail the polyphase decimator 804 and digital quadrature demodulator 802 shown in FIG. 8, illustrating a polyphase filter. The modulated IF phased digital signals 900 are input as shown to each of N number of subfilters, identified by reference numerals 902 thru 916, with subfilters 908 thru 914 not shown. In the example embodiment shown, N=8 and therefore there are eight subfilters, as illustrated. Different from a standard polyphase decimator, the polyphase decimator 306 does not time delay the input signal, and thus receives a plurality of inputs signals, for input to the subfilters 902-916.

Each subfilter 902-916 has a specific transfer function $E_i(z)$. The transfer function depends on the coefficients and structure of the overall digital FIR filter. For example, assuming the overall FIR filter (decimator) is designed with 64 taps, each subfilter would have eight coefficients (every Mth coefficient of the 64). Therefore, for each of the N (8) paths (I and Q), each subfilter applies its respective coefficients to eight consecutive samples in its respective path. As was described above, the quadrature demodulator 802 may be implemented by modifying the coefficients of the subfilters 902-916. The outputs of subfilters 902-916 are summed to generate the I and Q demodulated digital signals.

Now referring back to FIG. 8, the inputs to the combination of the decimator 804 and quadrature demodulator 802 comprises N=8 inputs at the input sampling rate (i.e., eight inputs each at a sample rate of 350 Msps). These digital inputs were generated from an A/D sigma-delta converter 708. In one embodiment, the sigma-delta converter 708 is constructed or configured as a single unit with multiple inputs/outputs. It will be understood that the sigma-delta converter 708 may be constructed with different configurations or structures as desired by those skilled in the art. In an example embodiment, the A/D sigma-delta converter 708 includes a bank or plurality of A/D sigma-delta converters 801, as shown, with each converter 801 receiving and processing an RF signal stream. As described earlier, and will be appreciated, each partitioned and phased input sample to the converters 801 is an RF signal. Each phased analog signal is digitized to a digital word or binary value having n number of bits. The input signals are sigma-delta A/D converted to a single or multi-bit output (each input and output operating at the sample rate of 350 Msps).

The A/D sigma-delta converter 708 (or converters 801) combine, or operate, effectively, in one example embodiment, to form an "N-path" sigma-delta converter. An N-path converter comprises N identical internal sigma-delta A/D converters operating in parallel. In such a converter, the inputs and outputs to each internal sigma-delta A/D converter have been demultiplexed/multiplexed such that the overall structure behaves as a single sigma-delta converter operating at N times the operating rate of each of the internal converters. In one or more embodiments, the input data streams are already effectively generated by the phased sample and hold circuit 706. An advantage of this approach is that at a high operating rate (Fs) it is more practical to implement the multiple internal A/D sigma-delta converters running at the reduced operating rate (Fs/N) than implementing a single converter operating at the high rate (Fs).

Now referring to FIG. 10, there illustrated a detailed block diagram of an example embodiment of the single A/D sigma-delta converter 801 shown in FIG. 8. Each A/D sigma-delta converter 801 includes a sample and hold circuit 800 (shown as part of the sample and hold circuit 706), a summation circuit 1002, a quantizer 1004, a difference circuit 1006 a filter circuit 1008 having transfer function $H(z)$, and a digital-to-analog (D/A) converter 1010. The transfer function $H(z)$ is designed to "shape" noise out of the band of interest. The summation circuit 1002 sums the output (in the form of an analog signal) from the sample and hold circuit 800 with the output of the filter circuit 1008 to generate the input to the quantizer 1004. The digital output of the quantizer 1004 is converted to analog by the D/A converter 1010. The outputs of the sample and hold circuit 800 and D/A converter 1010 are input to the difference circuit 1006 whose output is input to the filter circuit 1008. As will be appreciated, each of the quantizer 1004 and D/A converter 1010 are n-bit devices, as desired.

Now referring back to FIGS. 6 and 7, the RF signal inputs to the A/D sigma-delta converter 708 were generated by the phased sample and hold circuit 706 that selectively samples and delays the RF signal stream into N parallel RF signal streams. The circuit 706 samples (offset by one period of the sampling rate) the input RF signal and holds each sample for a time period equal to N times the target sampling period of the RF signal. The circuit 706 is illustrated as including multiple sample and hold elements 800. In the example embodiment, the RF signal stream has a carrier frequency of 2.1 GHz, and the desired target sampling rate is 2.8 Gsps. Prior to input to the phased sample and hold circuit 706, the RF signal is filtered by an analog RF bandpass filter 702 (such as a SAW filter) to pass the image/signal at the desired carrier frequency, thus removing any signals/images outside the RF band of interest (i.e., the desired carrier frequency). As will be appreciated, the unfiltered RF signal was received by the receiver 700 (from an antenna, not shown).

As will be appreciated, the local oscillator 704 is used to select and hold each phase (N=8) at the input of the A/D sigma-delta converter. Thus, the analog local oscillator 704 operating at a frequency of 2.8 GHz would be utilized.

The architecture provides the advantage that the sample and hold circuit 706 operates at a high sampling rate (Fs) by separating the single RF signal into multiple parallel signal streams. As such, all other elements of the receiver 700 (subsequent to the sample and hold circuit) may operate at the lower rate (including the A/D converters).

RF Communications Network

Now referring to FIG. 11, there is illustrated a block diagram of an example wireless communications network 1120. The wireless communications network 1120 includes a first wireless communications device 1100 and a second wireless communications device 1104. The first wireless communications device 1100 is shown including the transmitter 200 and the receiver 700 as described above and in accordance with one or more embodiments. Optionally, the communications device 1100 may include only one of the transmitter 200 and receiver 700 and further include a receiver or transmitter, respectively, that may be of a type from the prior art (or analog). Similarly, the second wireless communications device 1104 includes the transmitter 200 and the receiver 700 as described above and in accordance with one or more embodiments. Optionally, the communications device 1104 may include only one of the transmitter 200 and receiver 700 and further include a receiver or transmitter, respectively, that may be of a type from the prior art (or analog). The two communications devices 1100 and 1104 communicate via RF signals utilizing an antenna 1102 and an antenna 1106, respectively, as shown.

The example wireless communications network 1120 may operate in accordance with one or more wireless protocols or technologies, such as CDMA, TDMA, FDMA, UMTS, etc. (and versions thereof). Further, the network 1120 may support circuit-switched, and packet-switched or packet data communications.

In the example embodiment in FIG. 11, the first communications device 1100 is illustrated as a mobile station or mobile terminal, such as a wireless handset, while the second communications device 1104 is illustrated as a base station, though not limited to such embodiment. The devices 1100, 1104 may be any device having wireless communications capabilities. As shown, the base station 1104 includes a base transceiver subsystem (BTS) 1108 that includes the transmitter 200 and the receiver 700. The BTS ling is connected to a base station controller (BSC) 1110. Collectively, the BTS 1108 and the BSC 1110 are logically referred to as the "base station" 1104. Multiple BTS 1108 sometimes share one BSC 1110. The BSC 1110 manages resource allocation among the several BTSs. More generally, the terms "base station" and "access network" refer to any entity (or collection of entities) that communicates wirelessly with mobile stations for communications sessions (e.g., circuit-switched or packet-switched). The base station 1104 is coupled to the public switched telephone network (PSTN) or other data or switched network. This path may include additional elements such as a mobile switching center (MSC)(not shown) coupled to the BSC 1110.

It may be advantageous to set forth definitions of certain words and phrases that may be used within this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of or the like; and if the term "controller" is utilized herein, it means any device, system or part thereof that controls at least one operation, such a device may be implemented in hardware, firmware or software, or some combination of at least two of the same. It should be noted that the functionality associated with any particular controller may be centralized or distributed, whether locally or remotely.

Although the various embodiments have been described in the foregoing detailed description and illustrated in the accompanying drawings, it will be understood by those skilled in the art that the claimed subject matter is not limited to the embodiment(s) disclosed but is capable of numerous rearrangements, substitutions and modifications without departing from the spirit and scope of the described embodiments as defined by the appended claims.

What is claimed is:

1. A receiver comprising:
a sampler operable to separate a radio frequency signal into a plurality of phased analog signals, wherein the plurality of phased analog signals comprises N parallel phased analog signals, N being an integer multiple of 4, and wherein the sampler comprises a polyphase filter, the polyphase filter comprising N sub-filters, each sub-filter being operable to filter a respective analog signal of the plurality of phased analog signals;
a sigma delta analog to digital converter system operable to convert the plurality of phased analog signals into a plurality of phased digital signals; and
a digital downconverter operable to combine and downconvert the plurality of phased digital signals into downconverted digital signal.

2. The receiver as recited in claim 1 wherein the polyphase filter comprises a digital finite impulse response filter.

3. The receiver as recited in claim 1, wherein:
the digital signal comprises I and Q signals; and
filter coefficients of the sub-filters are selected such that the sub-filters operate as a demodulator for generating the I and Q signals.

4. The receiver as recited in claim 1, further comprising a local oscillator coupled to the sampler, the local oscillator being operable to generate a local clocking signal for use in separating the radio frequency signal into the plurality of phased analog signals.

5. The receiver as recited in claim 1, further comprising:
a low noise amplifier operable to amplify a radio frequency input signal; and
an analog bandpass filter operable to filter the amplified radio frequency input signal to produce the radio frequency signal.

6. The receiver as recited in claim 1, further comprising a rate change element operable to change an input sampling rate associated with the I and Q signals to a different output sampling rate associated with the I and Q signals.

7. The receiver as recited in claim 6, wherein the input sampling rate is a sub-multiple of the output sampling rate.

8. A computer-implemented method comprising:
sampling and separating a radio frequency signal into a plurality of phased analog signals, wherein the plurality of phased analog signals comprises N parallel phased analog signals, N being an integer multiple of 4, and wherein the sampling is based, at least in part, on a polyphase filter, the polyphase filter comprising N sub-filters, each sub-filter being operable to filter a respective analog signal of the plurality of phased analog signals;
converting the plurality of phased analog signals into a plurality of phased digital signals using a sigma delta analog to digital converter system; and
combining and downconverting the plurality of phased digital signals into downconverted digital signal.

9. The computer-implemented method as recited in claim 8 wherein the polyphase filter comprises a digital finite impulse response filter.

10. The computer-implemented method as recited in claim 8, wherein:
the digital signal comprises I and Q signals; and
filter coefficients of the sub-filters are selected such that the sub-filters operate as a demodulator for generating the I and Q signals.

11. The computer-implemented method as recited in claim 8, further comprising generating a local clocking signal for use in separating the radio frequency signal into the plurality of phased analog signals.

12. The computer-implemented method as recited in claim 8, further comprising:
amplifying a radio frequency input signal; and
filtering the amplified radio frequency input signal to produce the radio frequency signal.

13. The computer-implemented as recited in claim 8, further comprising changing an input sampling rate associated with the I and Q signals to a different output sampling rate associated with the I and Q signals.

14. The computer-implemented method as recited in claim 13, wherein the input sampling rate is a sub-multiple of the output sampling rate.

15. Program instructions stored on hardware which, responsive to execution, cause the hardware to:
separate a radio frequency signal into a plurality of phased analog signals, wherein the plurality of phased analog signals comprises N parallel phased analog signals, N being an integer multiple of 4, and wherein the sample comprises a polyphase filter, the polyphase filter comprising N sub-filters, each sub-filter being operable to filter a respective analog signal of the plurality of phased analog signals;
convert the plurality of phased analog signals into a plurality of phased digital signals using a sigma delta analog to digital converter system; and combine and downconvert the plurality of phased digital signals into downconverted digital signal.

16. The program instructions as recited in claim 15, wherein the polyphase filter comprises a digital finite impulse response filter.

17. The program instructions as recited in claim 15, wherein:
the digital signal comprises I and Q signals; and
filter coefficients of the sub-filters are selected such that the sub-filters operate as a demodulator for generating the I and Q signals.

18. The program instructions as recited in claim 15, the receiver further configured to generate a local clocking signal for use in separating the radio frequency signal into the plurality of phased analog signals.

19. The program instructions as recited in claim 16, the receiver further configured to:
amplify a radio frequency input signal; and
filter the amplified radio frequency input signal to produce the radio frequency signal.

20. The program instructions as recited in claim 16, the receiver further configured to change an input sampling rate associated with the I and Q signals to a different output sampling rate associated with the I and Q signals.

* * * * *